United States Patent
Maley (10) Patent No.: US 8,138,847 B1
(45) Date of Patent: Mar. 20, 2012

(54) TEMPERATURE AND/OR VOLTAGE INDEPENDENT VOLTAGE CONTROLLED OSCILLATOR WITH PROGRAMMABLE GAIN AND/OR OUTPUT FREQUENCY RANGE

(75) Inventor: Reading Maley, San Francisco, CA (US)

(73) Assignee: Ambarella, Inc., Santa Clara, CA (US)

( * ) Notice: Subject to any disclaimer, the term of this patent is extended or adjusted under 35 U.S.C. 154(b) by 99 days.

(21) Appl. No.: 12/861,133

(22) Filed: Aug. 23, 2010

Related U.S. Application Data (60) Provisional application No. 61/319,501, filed on Mar. 31, 2010.

(51) Int. Cl.
*H03B 5/24* (2006.01)
*H03K 3/03* (2006.01)
*H03L 1/00* (2006.01)
*H03L 1/02* (2006.01)

(52) U.S. Cl. .......................... 331/186; 331/57; 331/176

(58) Field of Classification Search ............... 331/34, 331/57, 65, 66, 111, 143, 175, 176, 185, 331/186
See application file for complete search history.

(56) References Cited

U.S. PATENT DOCUMENTS

| | | | |
|---|---|---|---|
| 5,900,784 A * | 5/1999 | O'Sullivan | 331/2 |
| 2001/0028278 A1* | 10/2001 | Ooishi | 331/57 |

* cited by examiner

*Primary Examiner* — David Mis
(74) *Attorney, Agent, or Firm* — Christopher P. Maiorana, PC (57) ABSTRACT

An apparatus comprising a transconductance control circuit, a boost control circuit, a current computation circuit and an oscillator circuit. The transconductance control circuit may be configured to generate a current control signal in response to (i) a voltage control signal and (ii) a plurality of range control signals. The boost control circuit may be configured to generate a current boost signal in response to a reference current signal and an enable signal. The current computation circuit may be configured to generate a first control signal and a second control signal in response to the current boost signal and the current control signal. The oscillator circuit may be configured to generate an output signal oscillating at a particular frequency in response to the first control signal and the second control signal.

11 Claims, 8 Drawing Sheets

TEMPERATURE AND/OR VOLTAGE INDEPENDENT VOLTAGE CONTROLLED OSCILLATOR WITH PROGRAMMABLE GAIN AND/OR OUTPUT FREQUENCY RANGE

This application claims the benefit of U.S. Provisional Application No. 61/319,501, filed Mar. 31, 2010 and is hereby incorporated by reference in its entirety.

FIELD OF THE INVENTION

The present invention relates to oscillator circuits generally and, more particularly, to a method and/or apparatus for implementing a temperature and/or voltage independent voltage controlled oscillator with programmable gain and/or output frequency range.

BACKGROUND OF THE INVENTION

Conventional Voltage-Controlled Oscillator (VCO) circuits are used to generate clock signals used in a variety of electronic circuits. In digital systems, VCOs are often used in frequency synthesizer phase-lock loop (PLL) circuits. PLL circuits use a feedback loop to provide an input voltage to a VCO that generates a stable output clock signal having a frequency that is an accurate and known multiple of a system reference clock frequency. Still other circuits, such as FM radio receivers, use a VCO-based PLL arrangement to demodulate an incoming frequency-modulated (FM) radio signal.

VCOs are widely used and perform critical functions in both digital and analog electronic systems. VCOs used in electronic circuits are often designed to have the output frequency as a linear function of input control voltage where FOUT=KVCO*VCTRL+F_OFFSET, where F_OFFSET represents a constant offset frequency the VCO will generate when a control signal VCTRL is zero volts. KVCO is known as the VCO gain. A low gain is desirable in low-jitter applications. For a given noise on the input voltage, VCTRL (the corresponding change in output frequency) is ΔFOUT=KVCO*ΔVCTRL.

To be useful in a wide variety of applications, a VCO should be able to generate a wide range of output frequencies (i.e., from several megahertz to tens of gigahertz). However, having a low-gain can be at odds with the ability to generate a wide range of output frequencies since the input voltage range is typically limited by the supply voltage and/or other circuit bias constraints.

VCOs used in electronic circuits are often designed so the period of the output has the lowest possible variation in the output period (also known as period jitter) when operating at a stable input voltage. The output is often designed to have an accurate duty-cycle close to 50%. VCOs are also designed to function over a large temperature range. A wide operating temperature range specification is often difficult to meet since the VCO is constructed from temperature-variant devices, such as transistors and resistors, that have properties which vary widely with temperature. A conventional VCO is also often designed to tolerate voltage supply noise and tolerate large variation in device process parameters (i.e., resistor resistivity, transistor turn-on voltage, etc.).

Figure 1:
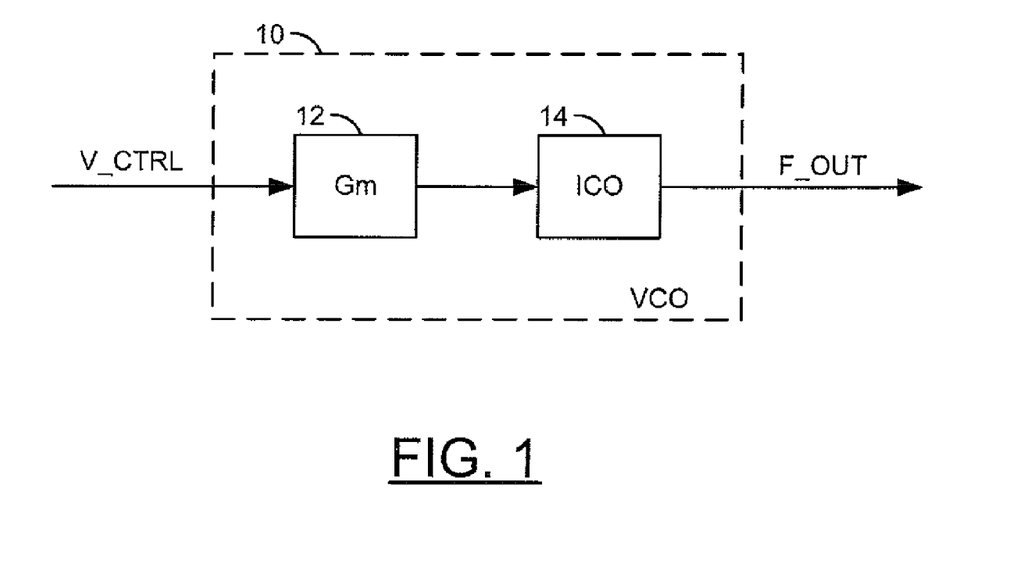
FIG. 1 is a block diagram illustrating high-level implementation of a conventional VCO.

Referring to FIG. 1, a circuit 10 is shown implementing a conventional VCO. The circuit 10 shows a circuit 12 and a circuit 14. The circuit 12 is shown as a voltage-to-current converter (also referred to as a V-to-I or transconductance or Gm block). The circuit 14 is shown as a current-controlled oscillator (ICO). A Metal-Oxide-Semiconductor Field Effect Transistor (MOSFET or MOS transistor) is often used as a transconductance device. The behavior of such a device can be characterized by the equation: $I=K(Vgs)^2$, where Vgs is the voltage between the gate terminal and the source terminal of the device, and K is a coefficient which depends on device dimensions, temperature, voltages on the bulk and drain terminals, construction material and fabrication details. ICOs are often made of a number of stages connected in a ring fashion. Single-ended ICOs are often made with an odd number of stages.

It would be desirable to implement a VCO that performs reliably, predictably and accurately over a wide temperature and/or voltage range using readily-available fabrication processes such as CMOS.

SUMMARY OF THE INVENTION

The present invention concerns an apparatus comprising a transconductance control circuit, a boost control circuit, a current computation circuit and an oscillator circuit. The transconductance control circuit may be configured to generate a current control signal in response to (i) a voltage control signal and (ii) a plurality of range control signals. The boost control circuit may be configured to generate a current boost signal in response to a reference current signal and an enable signal. The current computation circuit may be configured to generate a first control signal and a second control signal in response to the current boost signal and the current control signal. The oscillator circuit may be configured to generate an output signal oscillating at a particular frequency in response to the first control signal and the second control signal.

The objects, features and advantages of the present invention include implementing a Voltage Controlled Oscillator that may (i) be temperature and/or voltage independent, (ii) implement a programmable gain, (iii) implement a programmable output frequency range and/or (iv) use readily-available fabrication processes.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
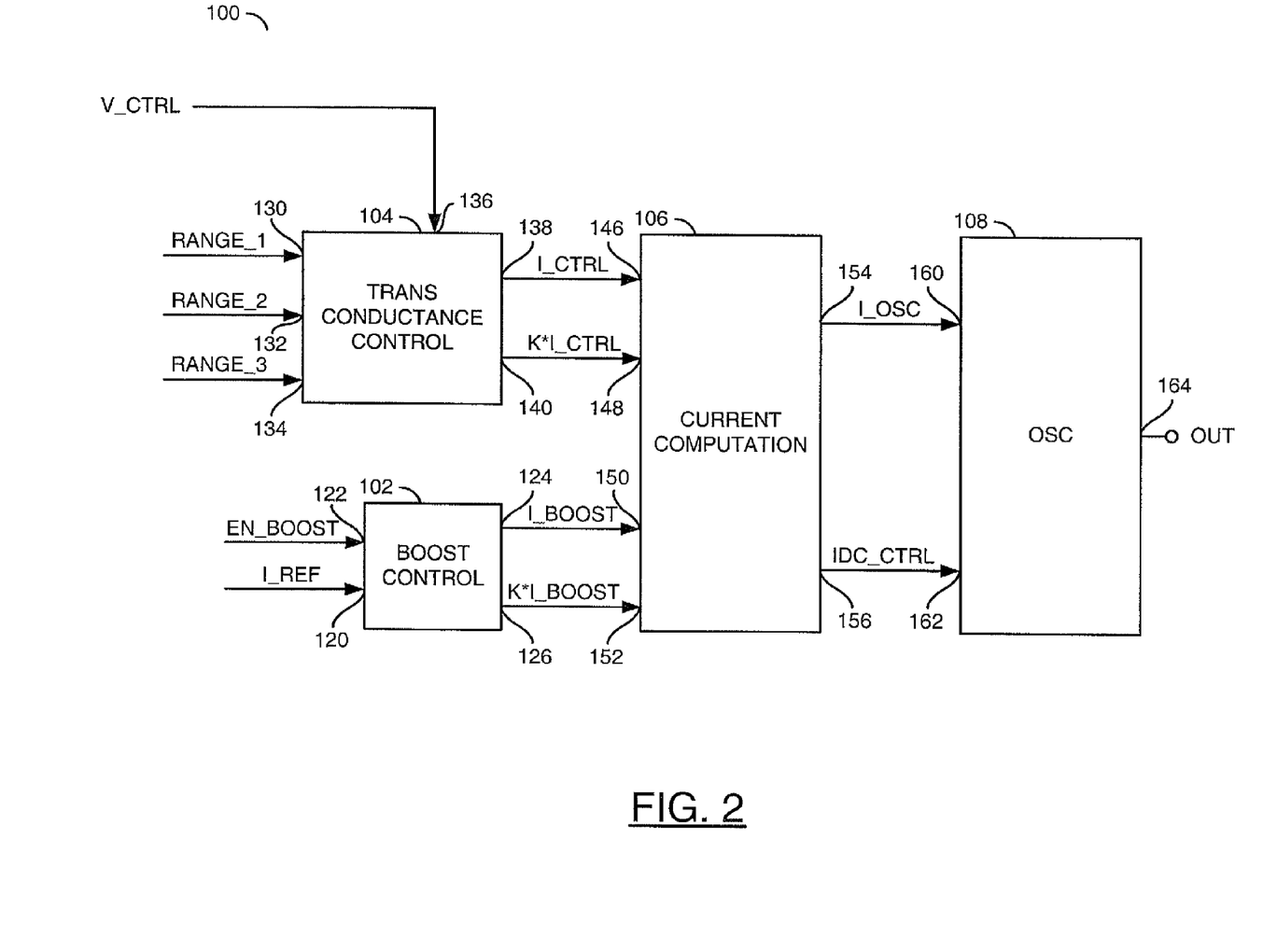
FIG. 2 is a block diagram of the present invention.

Referring to FIG. 2, a block diagram of a circuit 100 is shown in accordance with the present invention. The circuit 100 generally comprises a block (or circuit) 102, a block (or circuit) 104, a block (or circuit) 106 and a block (or circuit) 108. The circuit 102 may be implemented as a boost control circuit. The circuit 104 may be implemented as a transconductance control circuit. The circuit 106 may be implemented as a current computation circuit. The circuit 108 may be implemented as an oscillator circuit.

The circuit 102 may have an input 120 that may receive a signal (e.g., I_REF), an input 122 that may receive a signal (e.g., EN_BOOST), an output 124 that may present a signal (e.g., I_BOOST), and an output 126 that may present a signal (e.g., K*I_BOOST). The signal K*I_BOOST may be a multiple of the signal I_BOOST, where K is a multiplier factor. The signal EN_BOOST may be used to enable the boost control circuit 102. The signal I_REF may be a reference current. The signal I_REF may be generated by a central bias generation block, or other appropriate circuitry.

The circuit 104 may have an input 130 that may receive a signal (e.g., RANGE_1), an input 132 that may receive a signal (e.g., RANGE_2), an input 134 that may receive a signal (e.g., RANGE_3), an input 136 that may receive a signal (e.g., V_CTRL), an output 138 that may present a signal (e.g., I_CTRL), and an output 140 that may present a signal (e.g., K*I_CTRL). The signal K*I_CTRL may be a multiple of the signal I_CTRL, where K is a multiplier factor. The signals RANGE_1, RANGE_2, and RANGE_3 may be control signals used to change the transconductance GM (e.g., the slope of a graph of the signal I_CTRL versus the signal V_CTRL). While three control signals are shown, the particular number of control signals may be varied to meet the design criteria of a particular implementation.

The circuit 106 may have an input 146 that may receive the signal I_CTRL, an input 148 that may receive the signal K*I_CTRL, an input 150 that may receive the signal I_BOOST, an input 152 that may receive the signal K*I_BOOST, an output 154 that may present a signal (e.g., I_OSC), and an output 156 that may present a signal (e.g., IDC_CTRL).

The circuit 108 may have an input 160 that may receive the signal I_OSC, an input 162 that may receive the signal IDC_CTRL and an output 164 that may present a signal (e.g., OUT). The signal OUT may be a signal that oscillates at a particular frequency and duty cycle. The frequency of oscillation of the signal OUT may be controlled in response to the signal I_OSC and/or the signal IDC_CTRL.

Figure 3:
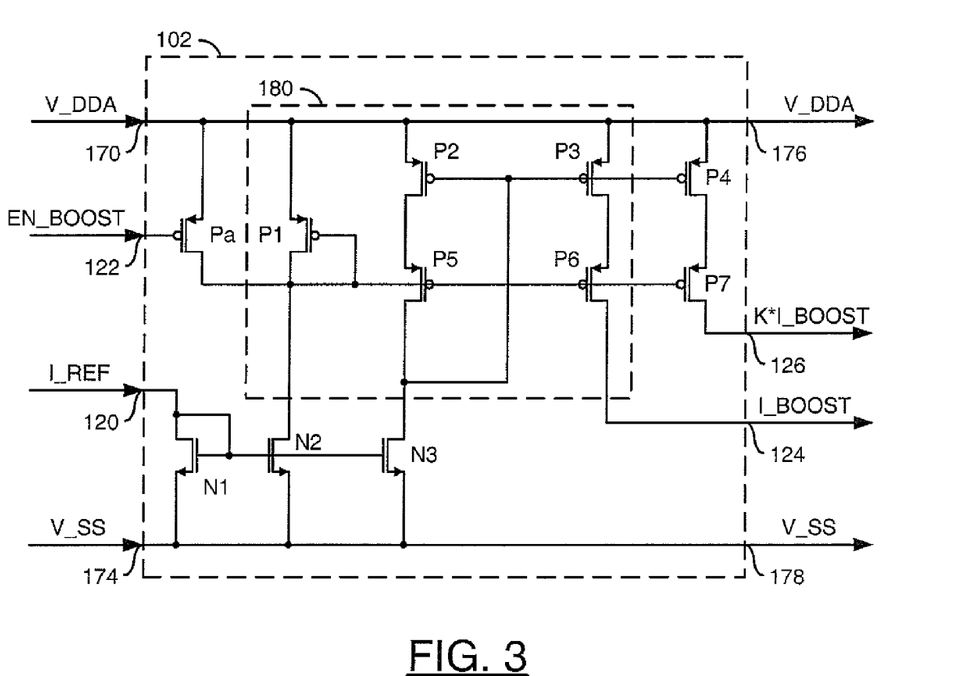
FIG. 3 is a circuit diagram of the boost control circuit implemented in CMOS.

Referring to FIG. 3, a circuit diagram of the boost control circuit 102 is shown. In one example, a CMOS embodiment of the circuit 102 may be implemented. However, other types of transistors may be implemented to meet the design criteria of a particular implementation. The boost control circuit 102 may have an input 170 that may receive a supply voltage signal (e.g., V_DDA) and an input 174 that may receive a ground voltage signal (e.g., V_SS). The supply voltage signal V_DDA may be considered a voltage supply or voltage source. The ground voltage signal V_SS may be considered a ground, or common reference voltage. The supply voltage signal V_DDA may be passed to the circuit 102 and the circuit 104. The supply voltage signal V_DDA may be passed to the circuit 108. The ground signal V_SS may be passed to the circuit 102, the circuit 104, the circuit 106 and the circuit 108.

The boost control circuit 102 generally comprises a number of transistors P1-P7, a transistor Pa, and a number of transistors N1-N3. In one example, the transistors P1-P7 and the transistor Pa may be implemented as P-channel transistors. In one example, the transistors N1-N3 may be implemented as N-channel transistors. The transistors P1, P2, P3, P5 and P6 may be implemented as a cascode current mirror circuit 180. The boost control circuit 102 may be used to increase the DC current of the signal I_REF for a high power, low jitter and/or high frequency operation of the signal OUT. The signal I_BOOST may also be programmable to a variety of values by switching in and/or out legs of a current mirror formed by the transistors N1, N2 and N3.

Figure 4:
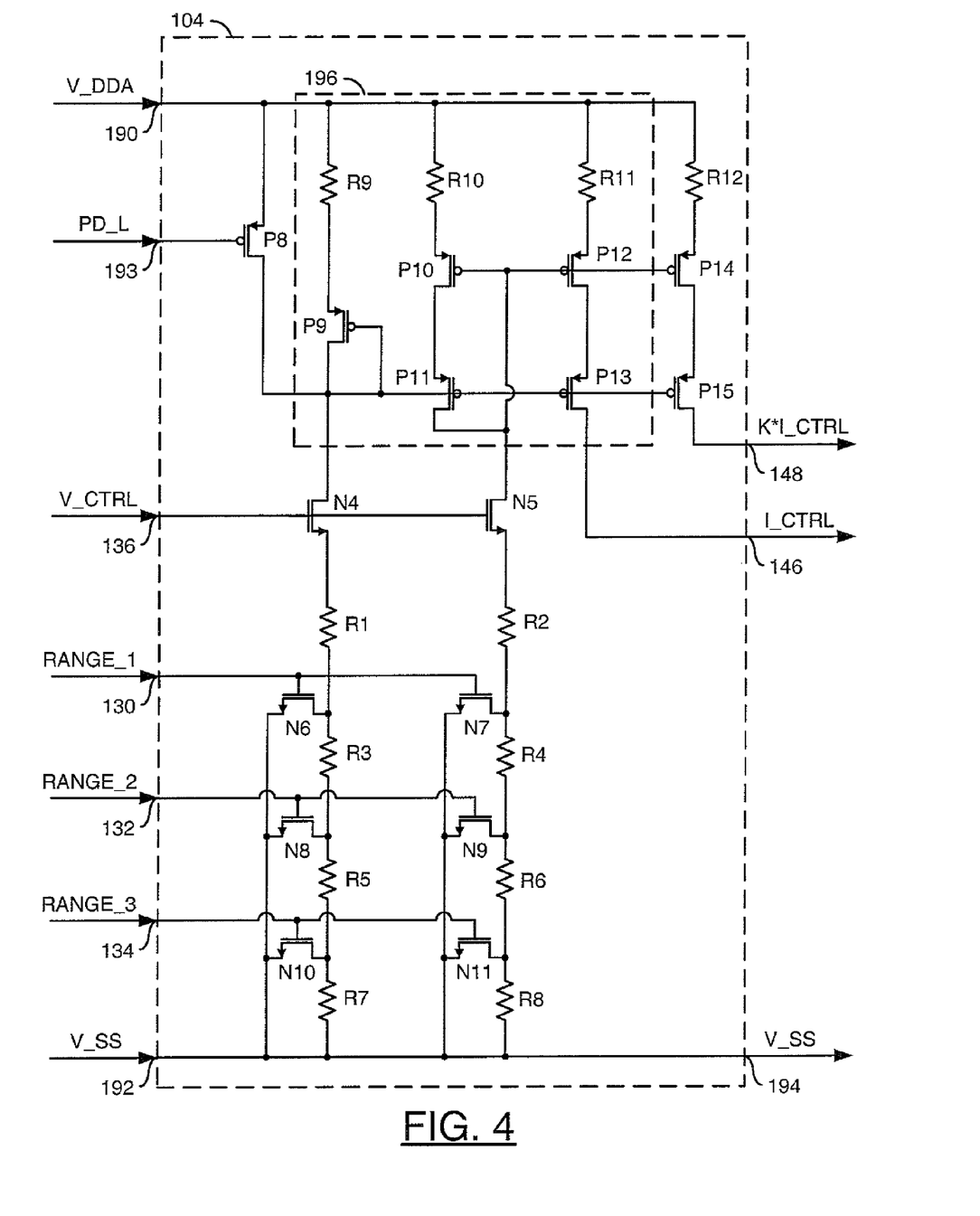
FIG. 4 is a circuit diagram of the transconductance control circuit implemented in CMOS.

Referring to FIG. 4, a circuit diagram of the transconductance control circuit 104 is shown. The transconductance control circuit 104 may be used to select the VCO output frequency range, which in turn may be used to determine the VCO gain (e.g., KVCO). The transconductance control circuit 104 generally comprises a number of transistors P8-P15, a number of transistors N4-N11 and a number of resistors R1-R12. In one example, the transistors P8-P15 may be implemented as P-channel transistors. In one example, the transistors N4-N11 may be implemented as N-channel transistors. The transconductance control circuit 104 may have an input 190 that may receive the supply voltage signal V_DDA, an input 192 that may receive the common voltage signal V_SS, and an input 193 that may receive a signal (e.g., PD_L). The signal PD_L represents a power-down inverse signal that may be an inverse of a power-down signal PD (to be discussed in more detail in connection with FIG. 7).

The transconductance control circuit 104 may have a digitally-selectable transconductance. The transconductance GM of the circuit 104 may be defined to be a change in the output current I_CTRL for a given change in the input voltage signal V_CTRL. The transconductance may be determined by a selection of a resistance values R2, R4, R6 and R8 that may be connected between the source terminal of the transistor N5 and the common ground voltage signal V_SS, and the resistance values R1, R3, R5 and R7 that may be connected between the source terminal of the transistors N4 and the common ground voltage signal V_SS. The signals RANGE_1, RANGE_2 and/or RANGE_3 may select one of several resistance values by shorting one or more of the resistor terminals R3-R8 to the common ground voltage signal V_SS.

A low-swing cascode mirror structure 196 may be used to implement supply noise immunity. The transconductance GM, or the current I_CTRL, a function of the signal V_CTRL, may vary significantly depending on the process, temperature and/or voltage supply level of the circuit 104. The cascade mirror structure 196 may include one or more PMOS source resistors R10-R11 which may be used to help reduce and/or minimize current output variances. The PMOS source resistors R10-R11 may provide an upper limit on the current of the signal K*I_CTRL and/or the signal I_CTRL. The mirror structure 196 may be implemented as a source-degenerated PMOS mirror and may also provide temperature independence across the full range of voltages of the signal V_CTRL. The range control circuit 104 may operate independently of temperature variations by setting the sizes of the resistors R10-R11 and the PMOS transistors P10-P12 in order to take advantage of the different temperature coefficients of resistors versus mirror transistor devices. In general, an optimal setting of the ratio of the resistors R10/R11 and the ratio of the transistors P10/212 may be used to provide temperature independence. For example, in a typical CMOS process, an optimal setting of the ratio of the resistor R10 divided by the resistor R11 may be around 4.0. An optimal setting of a channel length of the transistor P10 divided by the channel length of the transistor P12 may be about 0.15. Such ratios are examples. The particular ratios may vary depending on the details of the particular fabrication process implemented.

Figure 5:
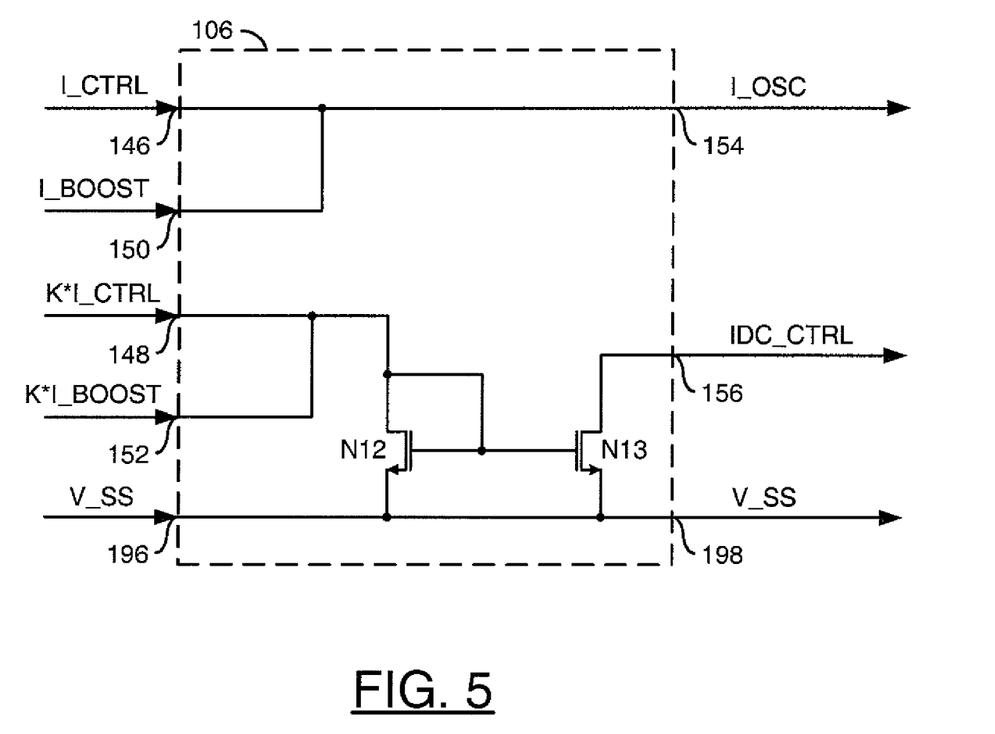
FIG. 5 is a circuit diagram of the current computation circuit implemented in CMOS.

Referring to FIG. 5, a circuit diagram of the current computation circuit 106 is shown. The circuit 106 generally comprises a number of transistors N12-N13. In one example, the transistors N12 and N13 may be implemented as N-channel transistors. The current computation circuit 106 may have an input 196 that may receive the signal V_SS. The common ground signal V_SS may be passed to the circuit 108 through the output 198. The signal I_CTRL and the signal I_BOOST may be added together, or summed, to generate the signal I_OSC. For example, the signal I_CTRL and the signal I_BOOST may be shorted together to create a single electrical node to generate the signal I_OSC.

Figure 6:
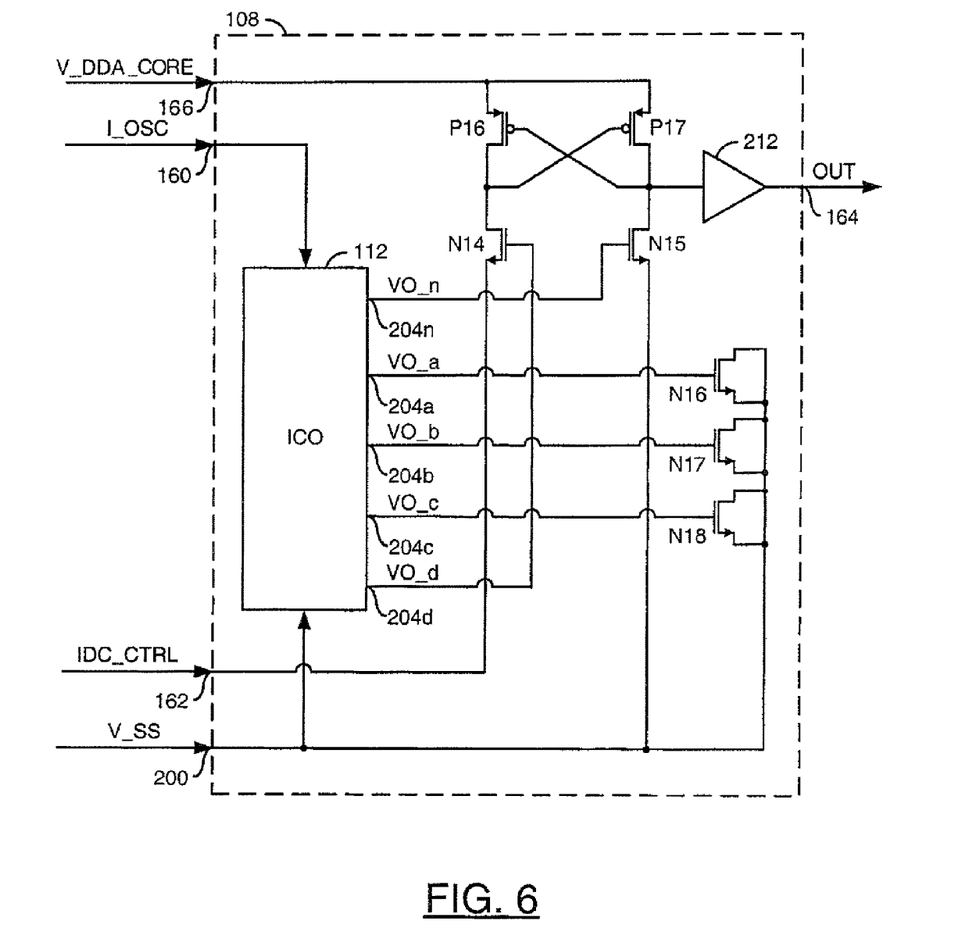
FIG. 6 is a circuit diagram of the oscillator circuit implemented in CMOS.

Referring to FIG. 6, a circuit diagram of the oscillator circuit 108 is shown. The circuit 108 generally comprises a block (or circuit) 112, a number of transistors P16-P17, a number of transistors N14-N16, and an inverter 212. In one example, the transistors P16-P17 may be implemented as P-channel transistors. In one example, the transistors N14-N18 may be implemented as N-channel transistors. The oscillator circuit 108 may have an input 200 that may receive the signal V_SS. The ICO circuit 112 may have an output 204a that may present a signal (e.g., VO_a), an output 204b that may present a signal (e.g., VO_b), an output 204c that may present a signal (e.g., VO_c), an output 204d that may present a signal (e.g., VO_d) and an output 204n that may present a signal (e.g., VO_n). In one example, the circuit 112 may be implemented as a single-ended current controlled oscillator (ICO). In one example, the circuit 112 may be implemented using an odd number of stages. The circuit 112 will be described in more detail in connection with FIG. 7.

The signal I_OSC may be a current that may be presented to the circuit 112. The circuit 112 may provide a high frequency and/or low jitter operation. The circuit 112 (in conjunction with the transconductance control circuit 104 and the current computation circuit 100) may allow the gain KVCO to be as low as possible while still working over a large range of process, temperature and/or voltage supply variations. A low gain KVCO may translate to low output period jitter for a given noise disturbance on the signal V_CTRL. The current mirror 180 (shown in FIG. 3), when activated, may add a static current to the signal I_OSC. The current presented to the circuit 112 may be defined as I_OSC=I_CTRL+ I_BOOST, where I_BOOST represents a static current. The static current I_BOOST may shift the VCO output frequency FOUT versus the voltage VCTRL curve up, but will not generally change the slope of the graph. The static current I_BOOST may allow a higher frequency output to be generated at a lower KVCO. A low-swing cascode current mirror (180 or 196) may be used to provide a specified power supply rejection ratio (PSRR). However, other types of current mirrors may be implemented to meet the design criteria of a particular implementation.

The circuit 112 may provide duty-cycle correction and/or a voltage level shifter for a single-ended operation. Without the present invention, a standard level-shifter using two ring oscillator outputs as complimentary inputs has a duty-cycle of approximately 40% (i.e., for a five stage oscillator). In addition to having a sub-optimal duty cycle, without the present invention the output of the circuit 112 will not reach the full digital voltage level of the signal V_DDA_CORE. Therefore, the output of the circuit 112 is shifted for use by downstream circuitry. The oscillator circuit 108 may correct the signal duty cycle and/or shift the signal voltage to standard logic levels to be used by downstream blocks. Duty-cycle correction uses a proportional copy of the total current IDC_CTRL may be equal to K*I_BOOST K*the current I_CTRL=K*(the current I_BOOST+the current I_CTRL)= the current I_OSC. The total ICO 112 current controls the rising edge rate of one of the nodes that switch the level-shifted output. A slower rising edge may cause the output stage to switch later than otherwise. The cross coupled PMOS transistor devices P16 and P17 may shift the output signal to full supply levels. The input of transistor P16 and the input of the transistor P17 may be timed to allow a 50% output duty cycle.

Figure 7:
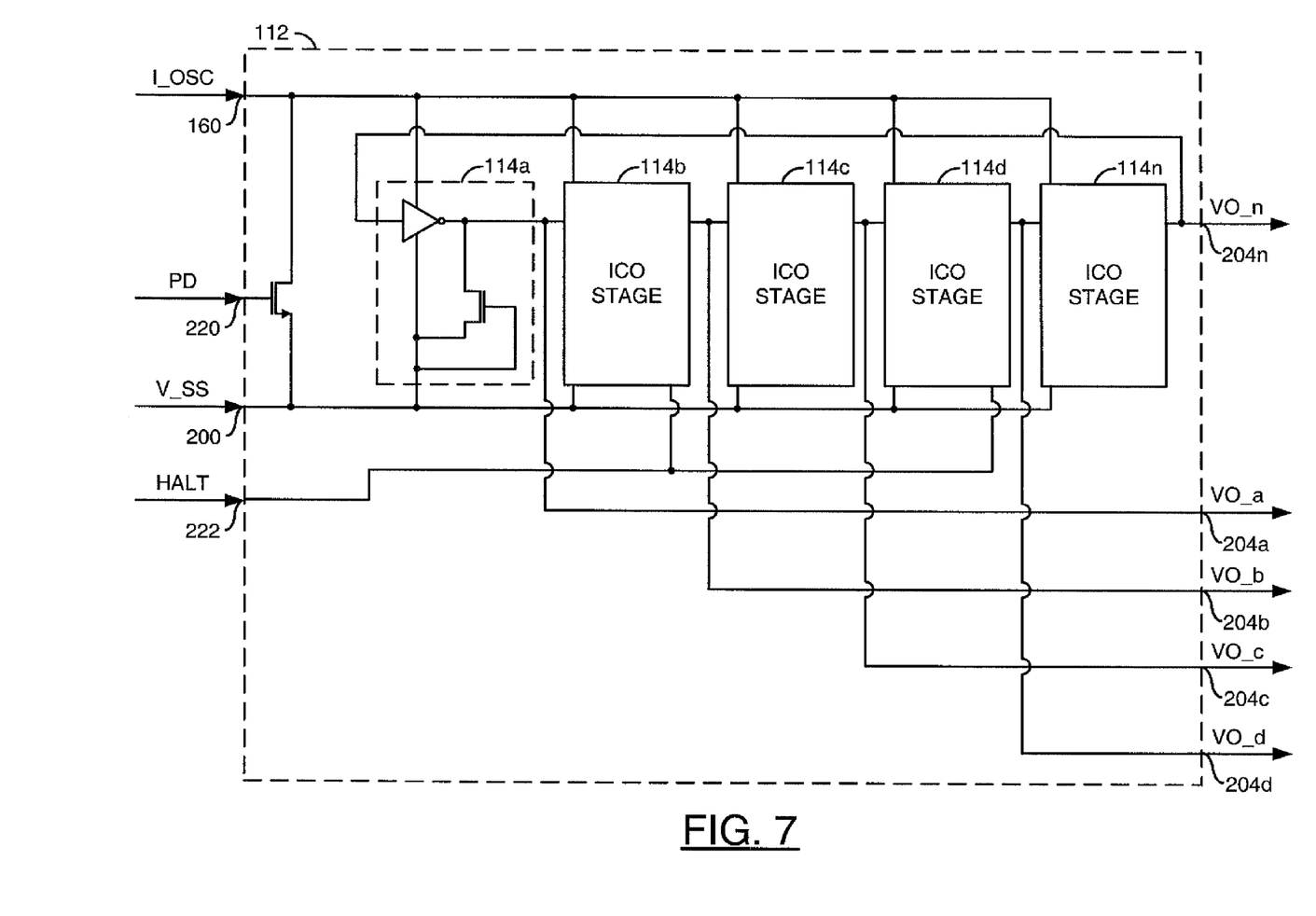
FIG. 7 is a circuit diagram illustrating a CMOS embodiment of a five-stage ICO showing halt and power-down controls.

Referring to FIG. 7, a circuit diagram of the ICO 112 is shown. The ICO 112 generally comprises a number of ICO stages 114a-114n. In one example, the current-controlled oscillator 112 may be implemented as a five-stage, single-ended ring oscillator.

The ICO 112 may have an input 220 that may receive a power down control signal (e.g., PD) and an input 222 that may receive a control signal (e.g., HALT). For a single-ended ICO with odd number of stages, a single-ended structure may be implemented. A single-ended structure may provide faster edge rates than a differential implementation. The signal HALT may be used to place two out of the five outputs in a known state. The signal HALT may also be implemented as a reset, which may provide proper start of oscillation of the signal OUT. The ICO 112 and other blocks of the circuit 100 may be designed to operate independently of temperature, semiconductor processing, and supply voltage variations. This may allow the VCO 100 to reach a lower jitter induced by noise in the power supply signal V_DDA. Lower KVCO gain may provide lower induced noise jitter for the signal OUT.

Figure 8:
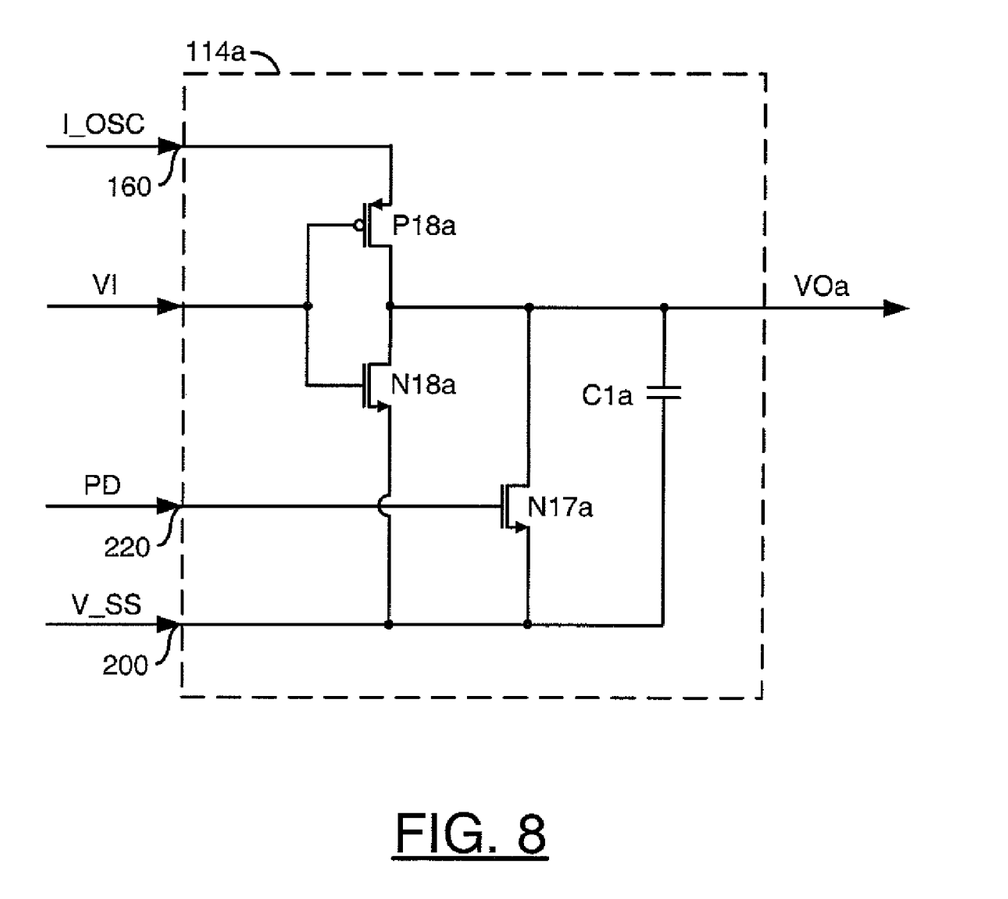
FIG. 8 is a circuit illustrating a CMOS embodiment of a single-ended ICO stage.

Referring to FIG. 8, a circuit illustrating CMOS implementation of a single-ended ICO stage 114a is shown. The stages 114b-114n may have similar implementations. The ICO stage 114a generally comprises a transistor P18a, a number of transistors N17a-N18a, and a capacitor C1a. In one example, the transistor P18a may be implemented as a P-channel transistor. In one example, the transistors N17a-N18a may be implemented as N-channel transistors. The ICO 114a may receive a voltage input signal VI and may present a voltage output signal VOa.

The capacitive load provided by the capacitor C1a may improve the variation of the gain KVCO across variations in temperature and/or processing. The capacitance of the load capacitor C1a is significantly greater than the capacitance of the MOS gates. The capacitance of the MOS gates may vary with changes in process, voltage, and/or temperature variations. However, the capacitance of the capacitor C1a may normally have a lower variation across voltage and/or process variations. Since the frequency of oscillation is not only a function of the input current, but also the capacitance each stage must drive, the oscillation frequency will vary less if the variation in capacitance is less. The load capacitor C1a may be designed to provide only a small variation in capacitance over temperature and/or processing parameters.

While the invention has been particularly shown and described with reference to the preferred embodiments thereof, it will be understood by those skilled in the art that various changes in form and details may be made without departing from the spirit and scope of the invention.

The invention claimed is:
1. An apparatus comprising:
a transconductance control circuit configured to generate a current control signal in response to (i) a voltage control signal and (ii) a plurality of range control signals;
a boost control circuit configured to generate a current boost signal in response to a reference current signal and an enable signal;
a current computation circuit configured to generate a first control signal and a second control signal in response to said current boost signal and said current control signal; and an oscillator circuit configured to generate an output signal oscillating at a particular frequency in response to said first control signal and said second control signal.

2. The apparatus according to claim 1, wherein said transconductance control circuit is further configured to generate a second current control signal as a multiple of said current control signal.

3. The apparatus according to claim 1, wherein said boost control circuit is further configured to generate a second current boost signal as a multiple of said current boost signal.

4. The apparatus according to claim 1, wherein said transconductance control circuit includes a low-swing cascode mirror.

5. The apparatus according to claim 1, wherein said boost control circuit includes a boost current mirror circuit.

6. The apparatus according to claim 1, wherein said oscillator circuit includes a current controlled oscillator.

7. The apparatus according to claim 1, wherein said boost control circuit comprises a plurality of CMOS devices.

8. The apparatus according to claim 1, wherein said frequency of oscillation of said output signal is independent of voltage and temperature variations.

9. The apparatus according to claim 1, wherein a duty cycle of oscillation of said output signal is independent of voltage and temperature variations.

10. An apparatus comprising:
    means for generating a current control signal in response to (i) a voltage control signal and (ii) a plurality of range control signals;
    means for generating a current boost signal in response to a reference current signal and an enable signal;
    means for generating a first control signal and a second control signal in response to said current boost signal and said current control signal; and
    means for generating an output signal oscillating at a particular frequency in response to said first control signal and said second control signal.

11. A method for implementing a voltage controlled oscillator comprising the steps of:
    (A) implementing a transconductance control circuit configured to generate a current control signal in response to (i) a voltage control signal and (ii) a plurality of range control signals;
    (B) implementing a boost control circuit configured to generate a current boost signal in response to a reference current signal and an enable signal;
    (C) implementing a current computation circuit configured to generate a first control signal and a second control signal in response to said current boost signal and said current control signal; and
    (D) implementing an oscillator circuit configured to generate an output signal oscillating at a particular frequency in response to said first control signal and said second control signal.

* * * * *